US009496892B2

(12) United States Patent
Frangou

(10) Patent No.: US 9,496,892 B2
(45) Date of Patent: Nov. 15, 2016

(54) APPARATUS FOR REDUCING DATA VOLUMES

(71) Applicant: Penteract28 Limited, London (GB)

(72) Inventor: George John Frangou, London (GB)

(73) Assignee: PENTERACT28 LIMITED, London (GB)

( * ) Notice: Subject to any disclaimer, the term of this patent is extended or adjusted under 35 U.S.C. 154(b) by 0 days.

(21) Appl. No.: 14/392,077

(22) PCT Filed: Mar. 11, 2014

(86) PCT No.: PCT/GB2014/000089
§ 371 (c)(1),
(2) Date: Sep. 11, 2015

(87) PCT Pub. No.: WO2014/147362
PCT Pub. Date: Sep. 25, 2014

(65) Prior Publication Data
US 2016/0043734 A1 Feb. 11, 2016

(30) Foreign Application Priority Data
Mar. 19, 2013 (GB) .................................. 1305070.3

(51) Int. Cl.
*H02M 7/30* (2006.01)
*H03M 7/30* (2006.01)

(52) U.S. Cl.
CPC ............. *H03M 7/3059* (2013.01); *H03M 7/55* (2013.01)

(58) Field of Classification Search
CPC .............................. H03M 7/55; H03M 7/3059
USPC ......................................... 341/142, 137, 87
See application file for complete search history.

(56) References Cited

U.S. PATENT DOCUMENTS

| | | | | |
|---|---|---|---|---|
| 5,892,503 A | * | 4/1999 | Kim | G06F 3/162 341/22 |
| 7,355,538 B2 | * | 4/2008 | Sayeh | G02F 7/00 341/137 |
| 7,903,008 B2 | * | 3/2011 | Regier | G01R 31/2841 341/142 |

OTHER PUBLICATIONS

Wikipedia, "Fuzzy logic", http://web.archive.org/web/201301311320/https://en.wikipedia.org/wiki/Fuzzy_lo, Jan. 31, 2013, fourteen (14) pages.
Wikipedia, "Principal component analysis", http://web.archive.org/web/20130317012102/http://en.wikipedia.org/wiki/Principal_component_analysis, Mar. 17, 2013, eighteen (18) pages.
Wikipedia, "Homology (mathematics)", http://web.archive.orq/web/20130131004352/http://en.wikipedia.orq/wiki/Homology_(mathematics), Jan. 31, 2013, six (6) pages.

(Continued)

*Primary Examiner* — Jean B Jeanglaude
(74) *Attorney, Agent, or Firm* — Iandiorio Teska & Coleman, LLP

(57) ABSTRACT

Apparatus for reducing the volumes occupied by data, comprising:
(1) a source systems data profiler and extractor subsystem,
(2) a stage 1 data reduction subsystem (2),
(3) a stage 2 data reduction persistent homology machine (3),
(4) a stage 3 data reduction holographic producer (4).
The apparatus uses information density holography to reduce the data volumes and may be used in many applications including cybernetic control in spacecraft, autonomous vehicles and manufacturing plant robotics.

3 Claims, 8 Drawing Sheets

(56) References Cited

OTHER PUBLICATIONS

Wikipedia, "Simplicial approximation theorem", http://web.archive.org/web/20060328203614/http://en.wikipedia.org/wiki/Simplicial_approximation_theorem, Mar. 28, 2006, one (1) page.

Wikipedia, "Holographic data storage", http://web.archive.org/web/20131361634/http://en.wikipedia.org/Holographic_data_storage, Mar. 13, 2013, eleven (11) pages.

* cited by examiner

APPARATUS FOR REDUCING DATA VOLUMES

This invention relates to apparatus for reducing data volumes.

There is a need to reduce the volume occupied by data.

It is an aim of the present invention to reduce the above need.

Accordingly, the present invention provides apparatus for reducing data volumes, which apparatus comprises:

(1) a source system data profiler and extractor subsystem comprising:
   a. a fuzzy logic controller comprising fuzzyfier, inference, and output handling,
   b. type reducer outputting meta-keys,
   c. a data numerifier, and
   d. a data normaliser;

(2) a stage 1 data reduction subsystem comprising:
   a. a two-step principle component analyser (PCA) having a covariance matrix calculator and an eigenvalues calculator, and
   b. a stage 1 fidelity analyser comprising:
     (i) a first dimensional reducer,
     (ii) a residual analysis classifier,
     (iii) a comparator, and
     (iv) a classify failure type 1 module;

(3) a stage 2 data reduction persistent homology machine (PHM), comprising:
   a. a rips complex calculator performing a simplicial approximation,
   b. a homology and groups calculator,
   c. a persistent homology convertor,
   d. a stage 2 fidelity analyser comprising:
     (i) a second dimensional reducer,
     (ii) datamorphology,
     (iii) an instruction sequence,
     (iv) a classify failure type 2 module, and
     (v) a second comparator; and (4) a stage 3 data reduction holographic production means comprising:
   a. optimum topological data representation, containing the datamorphology and instruction sequence,
   b. a read write (RW) recording system called a topological boundary surface (TBS) recorder which has written on its fluctuating surface the internal projection of the optimum topological data representation, and
   c. digital multiplexing of meta-keys with a hologram.

The apparatus may be one which includes destination systems which interact with the hologram and meta-keys without ever needing to reconstruct the source data.

The destination systems may comprise:
   a. source codec,
   b. digital mux/demux,
   c. meta-key cache,
   d. instruction sequence cache,
   e. datamorphology cache,
   f. feedback elements,
   g. a comparator,
   h. a controller,
   i. an aggregator, and
   j. an actuator.

The apparatus of the present invention uses information density holography (IDH). The IDH is a data movement, access and storage technology that reduces data volumes with a theoretical limit that can exceed 1,000,000 fold whilst maintaining a high level of fidelity and integrity. The IDH enables the apparatus of the present invention to be used in many applications, including cybernetic control in spacecraft, autonomous vehicles and in manufacturing plant robotics, that cannot presently be realised without interacting with petabytes of data. The apparatus of the present invention is able to reduce a petabyte of data ($1\times10^{15}$ bytes) down to a gigabyte ($1\times10^{9}$). Taking an extreme case where a petabyte of data would need to be uploaded, for example into the cloud, this would be impractical with even the fastest available compression and bulk transfer protocols which offer perhaps a 50 fold reduction in data volumes. The IDH as used in the apparatus of the present invention permits a most likely one-off batch upload over the currently available broadband upload speeds of $3.125\times10^{4}$ bytes/second in just 9 hours. Interactions requiring a terabyte are achievable in around 30 seconds, whilst those requiring from one to a few hundred gigabytes are virtually instantaneous (called asynchronous or real-time).

Highly parallel processing IDH hardware combines data compression, high-dimensional algebraic topological representation and dimensional reduction algorithms to reproduce and transmit data holographically. These algorithms encode an arbitrarily large dataset on a two-dimensional topological surface (the boundary to the region), just like a hologram. The algorithms can also find and display hidden properties of massive data sets as well as embedded control sequences, enabling the reduced volume of data to be moved at astonishing speeds which are many orders of magnitude greater than current methods.

The IDH as used in the apparatus of the present invention is based on applying the holographic principle in cosmology and information entropy equivalence to data. The description of a volume of space can be thought of as encoded on a boundary to the region, so that our 3D universe, might instead be "written" on a two-dimensional surface like a hologram. Analogously an arbitrarily large dataset can be encoded (written) on 'the boundary to the region' as a holographic-topological surface. The application of the holographic principle to big data is believed to be a completely unique insight, as is the application of dimensional reduction techniques to achieve holographic data reproduction to produce the huge data volume reductions achievable by the apparatus of the present invention.

The algebraic theory of topologies behind the IDH is that a compacted description (an unprecedented 100-1,000,000 fold bit reduction) of the shape of the data can be created, whilst still enabling deeper insights and patterns to be obtained than is possible with existing techniques. It is called IDH because the first stage of the data reduction process, whilst it reduces the total number of data dimensions, allows all the source data points to be retained. This is directly analogous to a density increase due to a volume reduction.

BRIEF DESCRIPTION OF THE SEVERAL VIEWS OF THE DRAWINGS

Embodiments of the invention will now be described solely by way of example and with reference to the accompanying drawings in which.

DETAILED DESCRIPTION OF THE INVENTION

Figure 1:
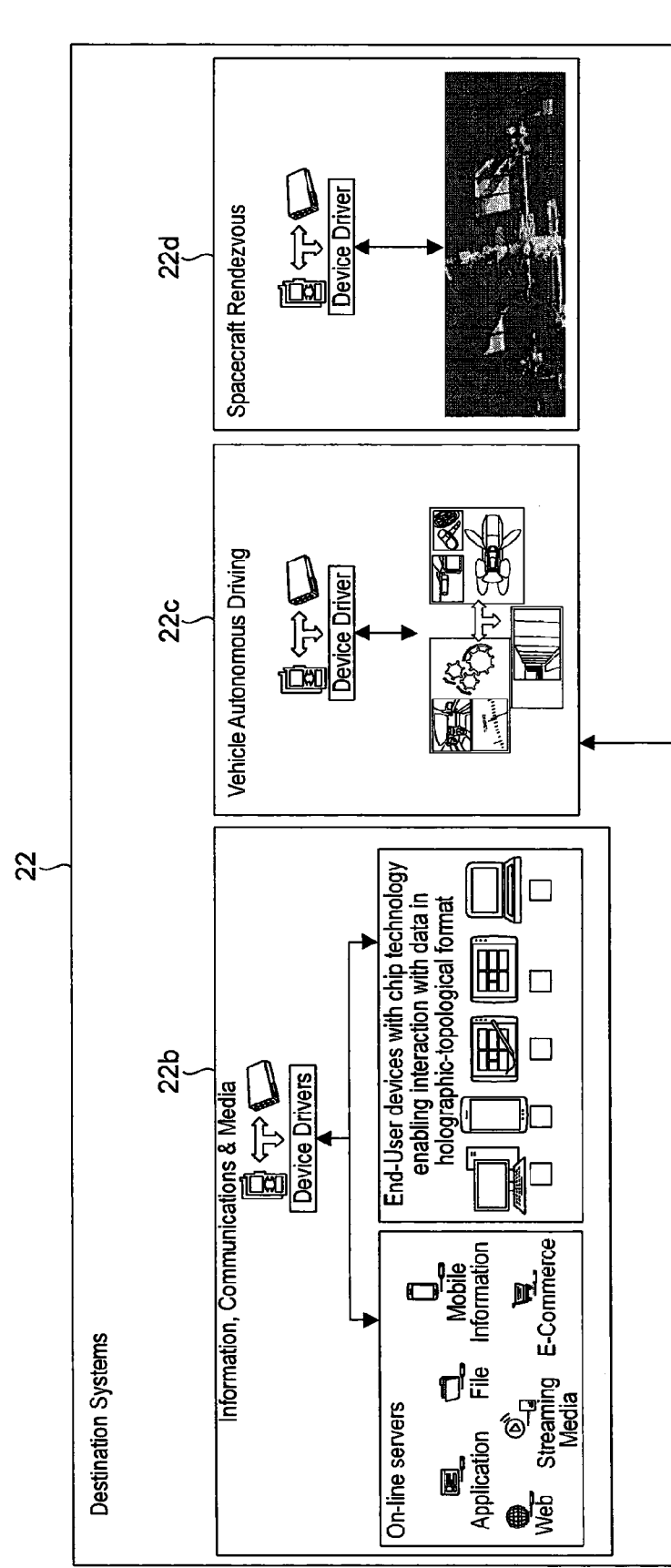
FIG. 1 shows examples of IDH used to facilitate applications requiring the communications of vast data volumes.
Figure 1:
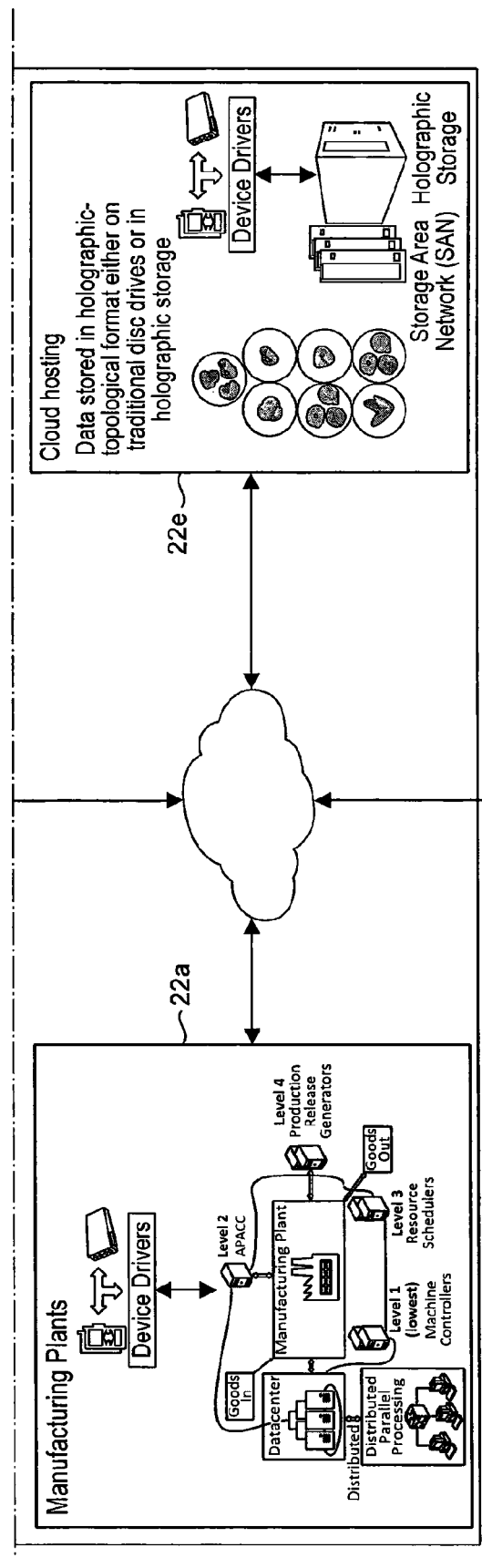
Figure 1:
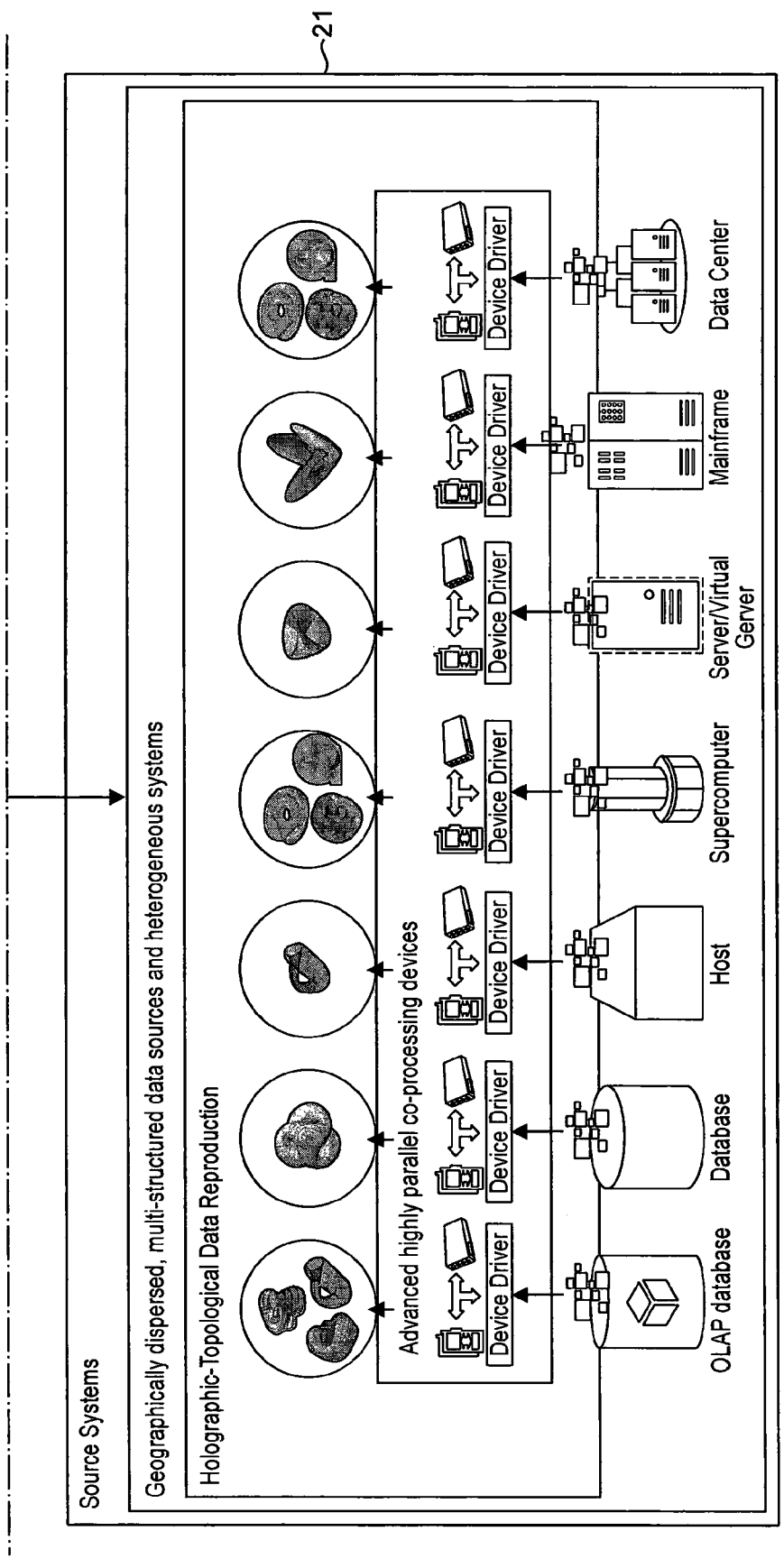

Referring to the drawings, Figure 1 illustrates examples of where and how IDH is applied. These examples include vehicle autonomous driving 22c, automated spacecraft rendezvous 22d, information, communications and media applications 22b, and automated manufacturing plants 22a. Geographically dispersed, multi-structured data sources from destination systems 21 is reduced in volume by firstly representing it as a complex mathematical topology, secondly reproducing it as a hologram and thirdly compressing. The systems 1 are shown in detail in FIG. 2. The operation of reproducing the data holographically reveals hidden structures in the data so that the hologram is not only a reproduction of the data but also an analysis. For certain applications shown in FIG. 1, the hologram can also contain control sequences for actuators. The data hologram can be accessed directly by end-user devices with highly parallel processing chip technology enabling interaction with data either in holographic format or by reproducing the original data sets. The data hologram can also be moved as a hologram and stored either on traditional disc drives or holographically further reducing storage volumes.

Figure 2:
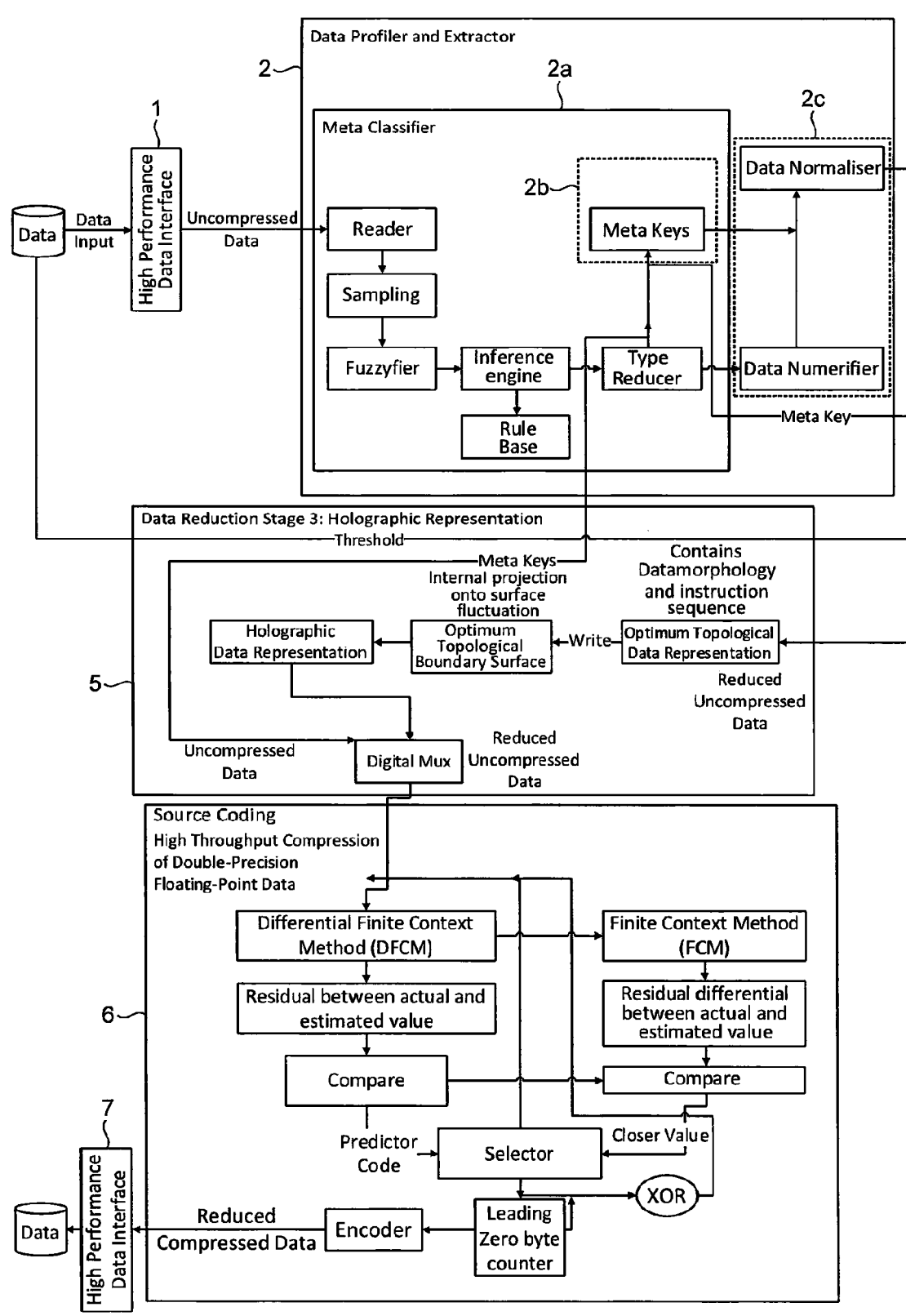
FIG. 2 shows IDH source apparatus sub-systems and an integration assembly.
Figure 2:
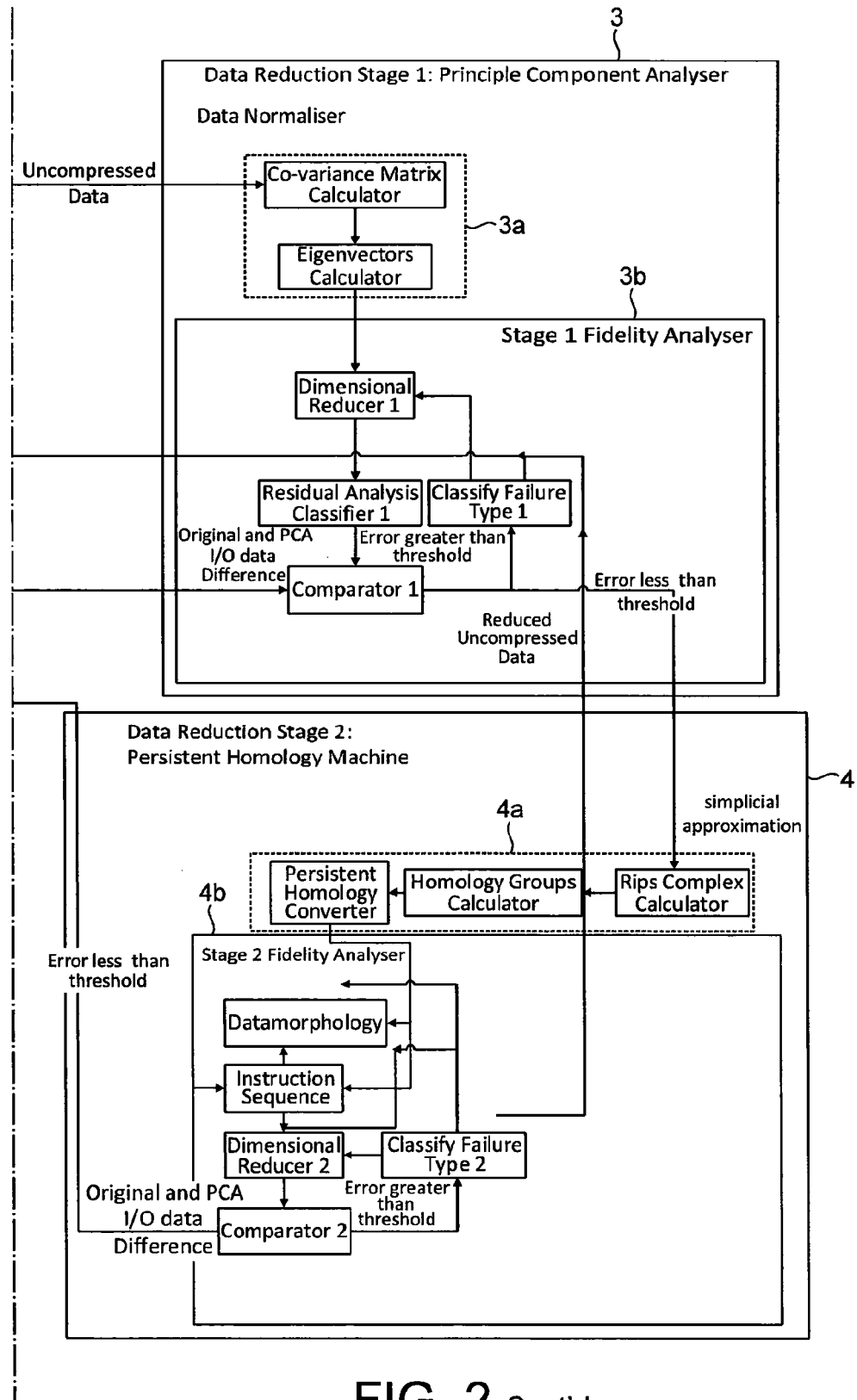

The uncompressed data is accessed from host computer systems through a high performance data interface 1 shown in FIG. 2, the input source to the IDH apparatus shown in FIG. 1. The uncompressed unreduced data enters the data profiler and extractor subsystem 2 shown in FIG. 2. The data is read, sampled and then 'fuzzified' in a fuzzy logic controller comprising fuzzyfier, inference, and output handling 2a. The purpose of the fuzzy logic circuit is to identify the meta-keys (the indexes) 2b enabling the data to be reproduced with a very high degree of fidelity. The inference engine identifies these meta-keys as relationships using the rule base and outputs these as 'fuzzy sets' to the type reducer. The type reducer outputs the meta-keys 2b and because the data will contain categories as text, it also outputs the data to a combined data numerifier and data normaliser 2c. The extracted and profiled data is now ready for the first stage of the reduction process.

The stage 1 data reduction subsystem apparatus 3 is essentially a two-step principle component analyser (PCA) 3a. The apparatus also contains a stage 1 fidelity analyser 3b. Once the covariance matrix and eigenvectors are calculated using the covariance matrix calculator and the eigenvectors calculator combination 3a, the data undergoes the first dimensional reduction. This can be up to a 35-fold reduction in the total data volume with no reduction in the number of data points (corresponding to an increase in information density). The first dimensional reducer is part of the stage 1 fidelity analyser 3b comprising the residual analysis classifier, comparator and classify failure type 1 module. The residual analyser module uncovers hidden structures within the data and also embedded control sequences. These components provide a test loop comprising logic circuits. The comparator compares the input data at source with the PCA output and measures the difference. This is the first point that the meta-keys 2b are used to correct for errors. If the error is greater than the threshold set, the comparator feeds the data to the classify failure type 1 module and checks against the meta-keys 2b back in the data profiler and extractor assembly 2. The process is iterative and the objective is to reduce the error to below the threshold value. When the error becomes less than the set threshold, the now reduced but still uncompressed data is output to the stage 2 data reduction apparatus 4 which is in the form of a persistent homology machine 4a (PHM).

The PHM comprises the rips complex calculator which performs the simplicial approximation, the homology and groups calculator and the persistent homology converter, see 4a in Figure 2. The PHM also contains the stage 2 fidelity analyser 4b. The reduced data output now in the form of a persistent homology undergoes further volume reduction in the dimensional reducer. This second dimensional reducer is contained within the stage 2 fidelity analyser 4b, which also comprises the datamorphology and instruction sequence modules together with similar modules to the stage 1 fidelity analyser 3b. The fidelity measurement and improvement process is similar this time with the classify failure type 2 module looking-up the meta-keys 2b and the second comparator in the stage 2 fidelity analyser 4b. This second comparator compares the source data with the persistent homology output. This stage further reduces the data to a factor of between 50 and 1000 of the source. When the error is less than the threshold, the data in the form of a persistent homology is output to the data reduction stage 3 holographic representation 5 for conversion to a hologram.

The data reduction stage 3 holographic representation 5 comprises optimum topological data representation, containing the datamorphology and instruction sequence which is output to a read write (RW) miniaturised recording system called a topological boundary surface (TBS) recorder. The TBS recorder has written on its fluctuating surface the internal projection of the optimum topological data representation. This is akin to including all the information content contained in the original data volume onto a surface which is analogous to creation of an optical hologram. However, the dimensionality can be many times greater than optical systems. The data is further reduced compared with the source now by a total factor of between 1,000 and 100,000. The data hologram is combined digitally with the meta-keys 2b to reproduce the data with the highest possible fidelity.

Reduced but still uncompressed, the combined signal is output through a digital multiplexor (mux) in the data reduction stage 3 holographic representation 5 to the source coding compressor 6. The design of the source coding compressor 6 is based on high throughput compression of double-precision floating-point data source coding (compression) system developed by Martin Burtscher and Paruj Ratanaworabhan at the School of Electrical and Computer Engineering, Cornell University, Ithaca, N.Y. 14853, United States of America. The design of the source coding compressor 6 will not be described further herein, other than to say that a realistic 1:10 compression is achievable with this technology. The total reduction possible with IDH plus source coding is 100-1,000,000 times of the source original. The reduced compressed data is output through a high performance data interface 7.

Figure 4:
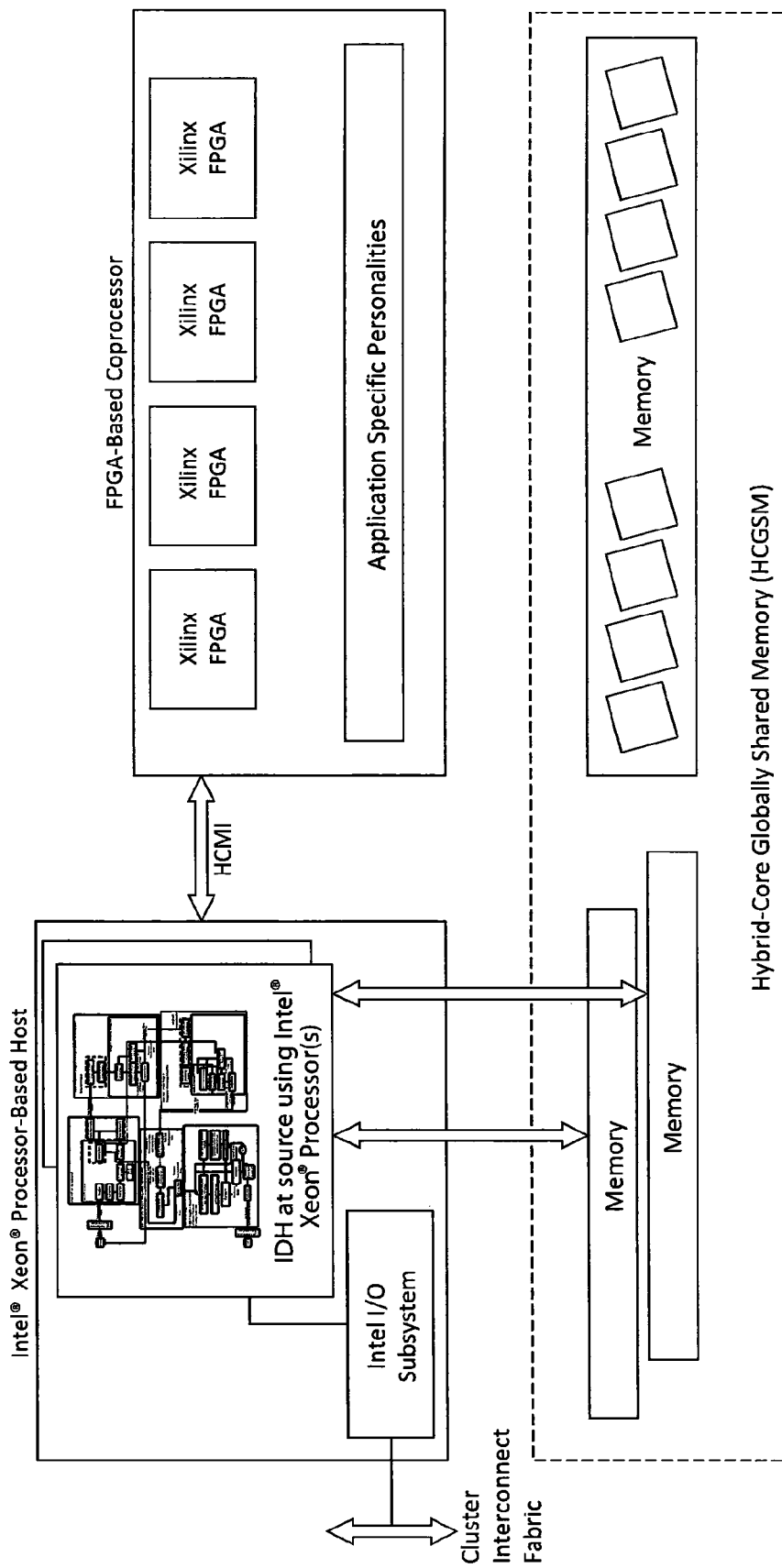
FIG. 4 shows Intel® Xeon® processor high performance computing for IDH sources.

The data reduction above happens virtually instantaneously using an architecture based on Intel® Xeon® processor as shown in detail in FIG. 4. It features a highly parallel memory subsystem to further increase performance. Programmable "on the fly," FPGAs are a way to achieve hardware-based, application-specific performance. Particular IDH algorithms, for example, are optimized and translated into code that is loaded onto the FPGAs at runtime.

Figure 3:
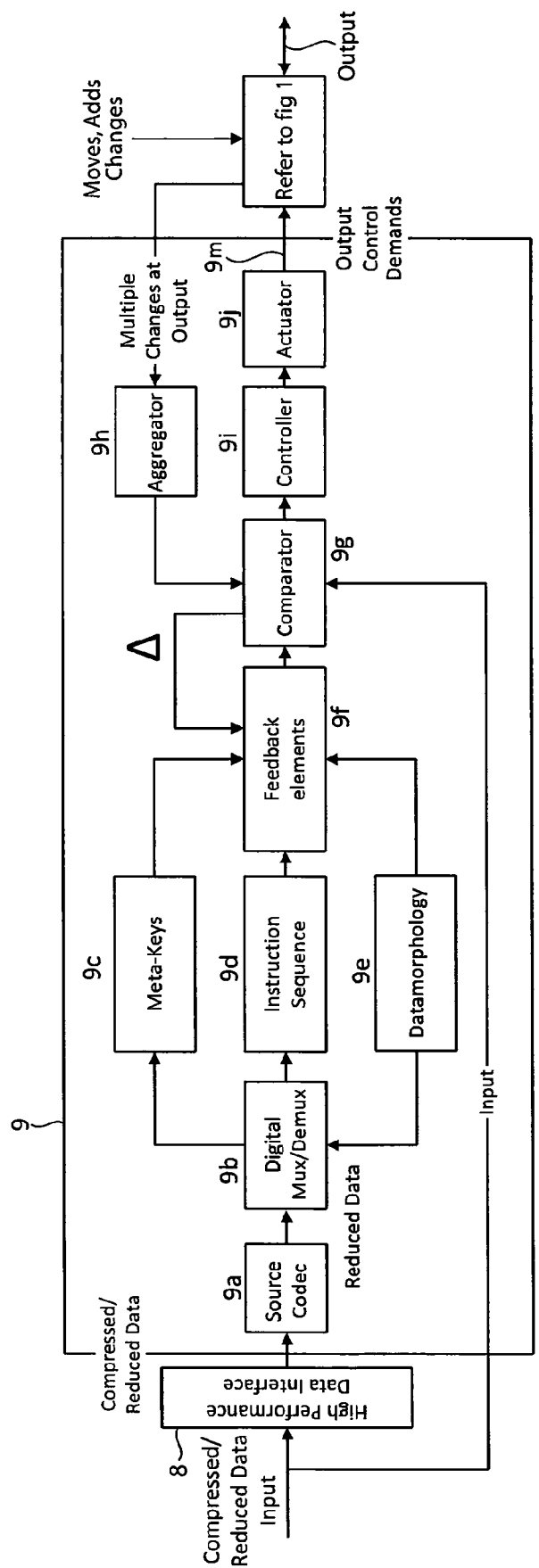
FIG. 3 shows an IDH destination apparatus system assembly.

FIG. 1 shows destination systems 22. The destination system electronics modules are shown as modules 9 in Figure 3. The destination systems interact with the hologram produced by the source technology of FIG. 2 and meta-keys 2b without ever needing to reconstruct the source data. To reconstruct the source data, similar electronics to that shown in FIG. 2 are required. The compressed data input comprising the hologram produced by the source technology of FIG. 2 and the meta-keys 2b from the data profiler and extractor 1 in FIG. 2 is accessed through a high performance data interface 8 in FIG. 3, which connects to destination subsystem assembly 9. The decoder module of the source codec 9a uncompresses the signal (essentially decoding it) and the demultiplexer module of the digital mux/demux 9b splits the signal into the meta-keys 9c, instruction sequence 9d and the datamorphology 9e. The other components are the feedback elements 9f, the comparator 9g, the controller 9i, the aggregator 9h and the actuator 9j. The actuator 9j outputs control demands via line 9m. The actuator output is generalised in FIG. 3 by a reference to FIG. 1. Adds, moves and changes AND/OR perturbations at the output are aggregated by the aggregator 9h and compared via the comparator 9g with the input signal. The differential is fed into the feedback elements 9f. The differential comprises AND/OR changes to the meta-keys 9c, instruction sequence 9d and datamorphology 9e. The differential is then fed back through the mux/demux 9b, source codec 9a and high performance data interface 8 to update the source data systems, see FIG. 1.

Figure 5:
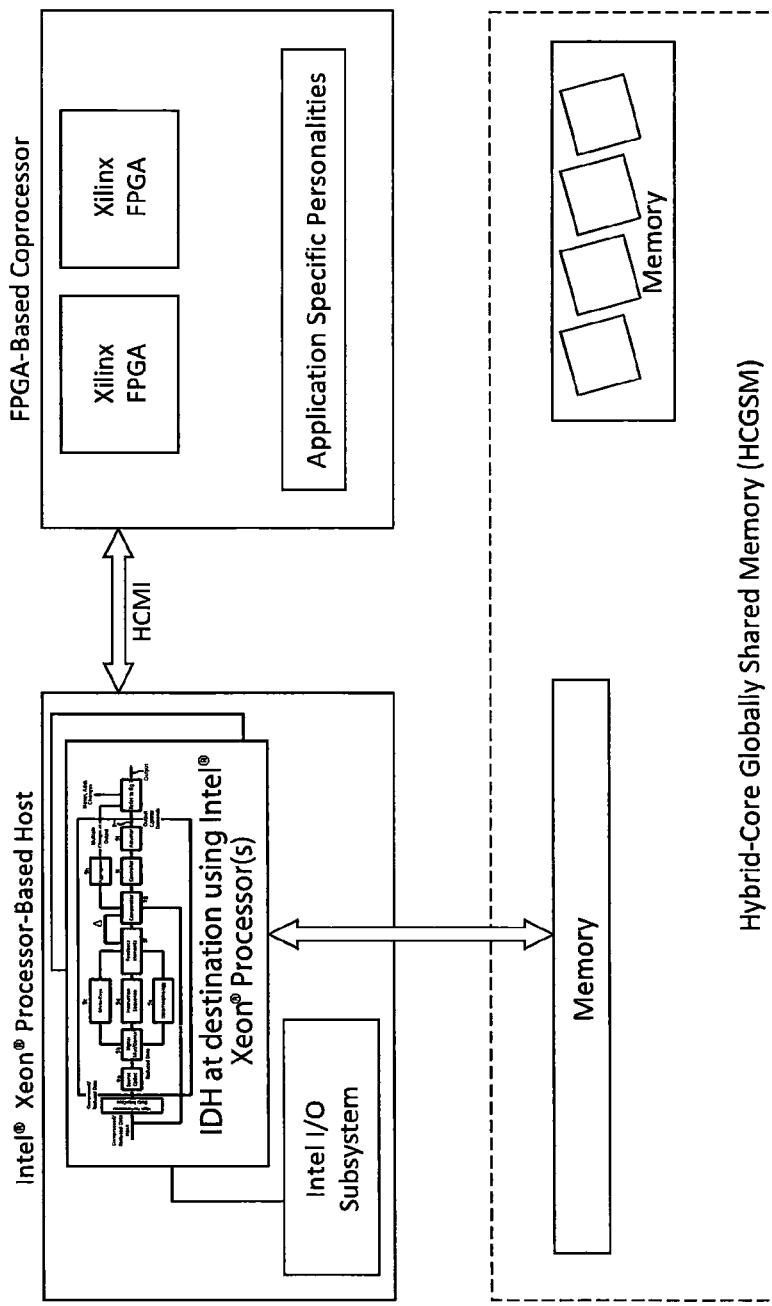
FIG. 5 shows Intel® Xeon® processor high performance computing for IDH destinations.

As with the source IDH system, the architecture for the destination systems is based on an Intel® Xeon® processor as shown in FIG. 5 but requires fewer processors and memory.

It is to be appreciated that the embodiments of the invention described above with reference to the accompanying drawings have been given by way of example only and that modifications may be effected. Individual components shown in the drawings are not limited to use in their drawings and they may be used in other drawings and in all aspects of the invention.

The invention claimed is:

1. Apparatus for reducing data volumes, which apparatus comprises:
   (1) a source system data profiler and extractor subsystem comprising:
      a. a fuzzy logic controller comprising fuzzyfier, inference, and output handling,
      b. type reducer outputting meta-keys,
      c. a data numerifier, and
      d. a data normaliser;
   (2) a stage 1 data reduction subsystem comprising:
      a. a two-step principle component analyser (PCA) having a covariance matrix calculator and an eigenvalues calculator, and
      b. a stage 1 fidelity analyser comprising:
         (i) a first dimensional reducer,
         (ii) a residual analysis classifier,
         (iii) a comparator, and
         (iv) a classify failure type 1 module;
   (3) a stage 2 data reduction persistent homology machine (PHM), comprising:
      a. a rips complex calculator performing a simplicial approximation,
      b. a homology and groups calculator,
      c. a persistent homology convertor,
      d. a stage 2 fidelity analyser comprising:
         (i) a second dimensional reducer,
         (ii) datamorphology,
         (iii) an instruction sequence,
         (iv) a classify failure type 2 module, and
         (v) a second comparator; and
   (4) a stage 3 data reduction holographic production means comprising:
      a. optimum topological data representation, containing the datamorphology and instruction sequence,
      b. a read write (RW) recording system called a topological boundary surface (TBS) recorder which has written on its fluctuating surface the internal projection of the optimum topological data representation, and
      c. digital multiplexing of meta-keys with a hologram.

2. Apparatus according to claim 1 and including destination systems which interact with the hologram and meta-keys without ever needing to reconstruct the source data.

3. Apparatus according to claim 2 in which the destination systems comprise:
   a. source codec,
   b. digital mux/demux,
   c. meta-key cache,
   d. instruction sequence cache,
   e. datamorphology cache,
   f. feedback elements,
   g. a comparator,
   h. a controller,
   i. an aggregator, and
   j. an actuator.

\* \* \* \* \*